(12) United States Patent
Inada et al.

(10) Patent No.: US 10,998,015 B2
(45) Date of Patent: May 4, 2021

(54) SEMICONDUCTOR STORAGE DEVICE

(71) Applicant: LAPIS SEMICONDUCTOR CO., LTD., Kanagawa (JP)

(72) Inventors: Toshio Inada, Kanagawa (JP); Katsuaki Matsui, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/801,320

(22) Filed: Feb. 26, 2020

(65) Prior Publication Data
US 2020/0312386 A1  Oct. 1, 2020

(30) Foreign Application Priority Data
Mar. 28, 2019 (JP) .............................. JP2019-063834

(51) Int. Cl.
*G11C 7/10* (2006.01)
*G11C 7/22* (2006.01)

(52) U.S. Cl.
CPC .............. *G11C 7/1045* (2013.01); *G11C 7/22* (2013.01)

(58) Field of Classification Search
CPC ................................ G11C 7/1045; G11C 7/22
USPC ...................................... 365/189.011, 189.05
See application file for complete search history.

(56) References Cited

U.S. PATENT DOCUMENTS

| | | | | |
|---|---|---|---|---|
| 5,204,841 A * | 4/1993 | Chappell | ................. | G06F 12/04 365/189.02 |
| 5,509,134 A * | 4/1996 | Fandrich | ............. | G06F 9/45512 711/103 |
| 6,183,633 B1 * | 2/2001 | Phillips | ................. | B01D 17/00 210/170.03 |
| 6,430,103 B2 * | 8/2002 | Nakayama | ........... | G11C 7/1006 365/189.05 |
| 7,145,829 B1 * | 12/2006 | Kim | ......................... | G11C 7/12 365/189.15 |
| 7,281,094 B2 * | 10/2007 | Ham | ........................ | G11C 8/16 365/154 |
| 7,573,753 B2 * | 8/2009 | Atwood | ............... | G11C 7/1075 365/189.011 |
| 7,656,739 B2 * | 2/2010 | Ham | ..................... | G11C 11/412 365/230.05 |
| 7,817,492 B2 * | 10/2010 | Kanari | ..................... | G11C 8/16 365/230.05 |
| 9,489,326 B1 * | 11/2016 | Maheshwari | ........ | G11C 7/1075 |
| 2005/0201163 A1 * | 9/2005 | Reichel | ..................... | G06F 1/12 365/189.05 |
| 2009/0231935 A1 * | 9/2009 | Golla | ................... | G11C 7/1084 365/189.16 |
| 2009/0307437 A1 * | 12/2009 | Lee | ...................... | G11C 7/1075 711/149 |

FOREIGN PATENT DOCUMENTS

JP         H04-049595 A         2/1992

*Primary Examiner* — Viet Q Nguyen

(74) *Attorney, Agent, or Firm* — Volentine, Whitt & Francos, PLLC

(57) ABSTRACT

A semiconductor storage device includes a memory array at which writing and reading of plural data are carried out, one pair of write registers that temporarily store write data that is to be written into the memory array, and one pair of read registers that temporarily store read data that is read-out from the memory array.

5 Claims, 6 Drawing Sheets

(56) References Cited

U.S. PATENT DOCUMENTS

2014/0198595 A1* 7/2014 Le .......................... G11C 7/12
365/203
2020/0117610 A1* 4/2020 Berger ................ G06F 12/0895

* cited by examiner

SEMICONDUCTOR STORAGE DEVICE

CROSS-REFERENCE TO RELATED APPLICATION

This application claims priority under 35 USC 119 from Japanese Patent Application No. 2019-063834 filed on Mar. 28, 2019, the disclosure of which is incorporated by reference herein in its entirety.

BACKGROUND

Technical Field

The present disclosure relates to a semiconductor storage device, and in particular, to a semiconductor storage device having a write data input terminal and a read data output terminal at which simultaneous access is possible.

Related Art

The semiconductor storage device disclosed in Japanese Patent Application Laid-Open (JP-A) No. H4-49595 for example is known as a semiconductor storage device having a write data input terminal and a read data output terminal at which simultaneous access is possible. The semiconductor storage device disclosed in JP-A No. H4-49595 is structured to include: an input port having an input circuit and a write control circuit that corresponds to the input circuit; an output port having an output circuit and a read control circuit that corresponds to the output circuit; a data bus having a write bus and a read bus; and a control bus having a write control bus and a read control bus.

In the semiconductor storage device disclosed in JP-A No. H4-49595, in order to make simultaneous access from the data input port and the data output port possible, the memory array section is divided into multiple parts by address assignation, the input and output of data are controlled more finely, and constraints on simultaneous access are reduced. A conflict resolution circuit that detects access to a same address is provided, and access to a same address is adjusted.

However, in the semiconductor storage device disclosed in JP-A No. H4-49595, in order to make simultaneous access possible from a data input port and a data output port, there are the problems that the number of circuits increases as a result of carrying out the division by address assignation on the main array section, and moreover, the conflict resolution circuit, which detects access to a same address and adjusts timing of the access, is needed.

SUMMARY

The present disclosure suppresses enlargement of the circuit scale in a semiconductor storage device having a write data input terminal and a read data output terminal at which simultaneous access is possible.

A semiconductor storage device relating to the present disclosure includes a memory array at which writing and reading of plural data are carried out, one pair of write registers that temporarily store write data that is to be written into the memory array, and one pair of read registers that temporarily store read data that is to be read-out from the memory array.

In accordance with the present disclosure, enlargement of the circuit scale can be suppressed in a semiconductor storage device having a write data input terminal and a read data output terminal at which simultaneous access is possible.

BRIEF DESCRIPTION OF THE DRAWINGS

Exemplary embodiments of the present disclosure will be described in detail based on the following figures, wherein.

DETAILED DESCRIPTION

Embodiments of the present disclosure are described in detail hereinafter with reference to the drawings. In the following embodiments, description is given by using, as an example of a semiconductor storage device relating to the present disclosure, a semiconductor storage device that uses DRAM (Dynamic Random Access Memory) cells in the memory section, and has a write data input terminal and a read data output terminal at which simultaneous access is possible, and is used, for example, as a buffer memory for images and communication data.

First Embodiment

Figure 1:
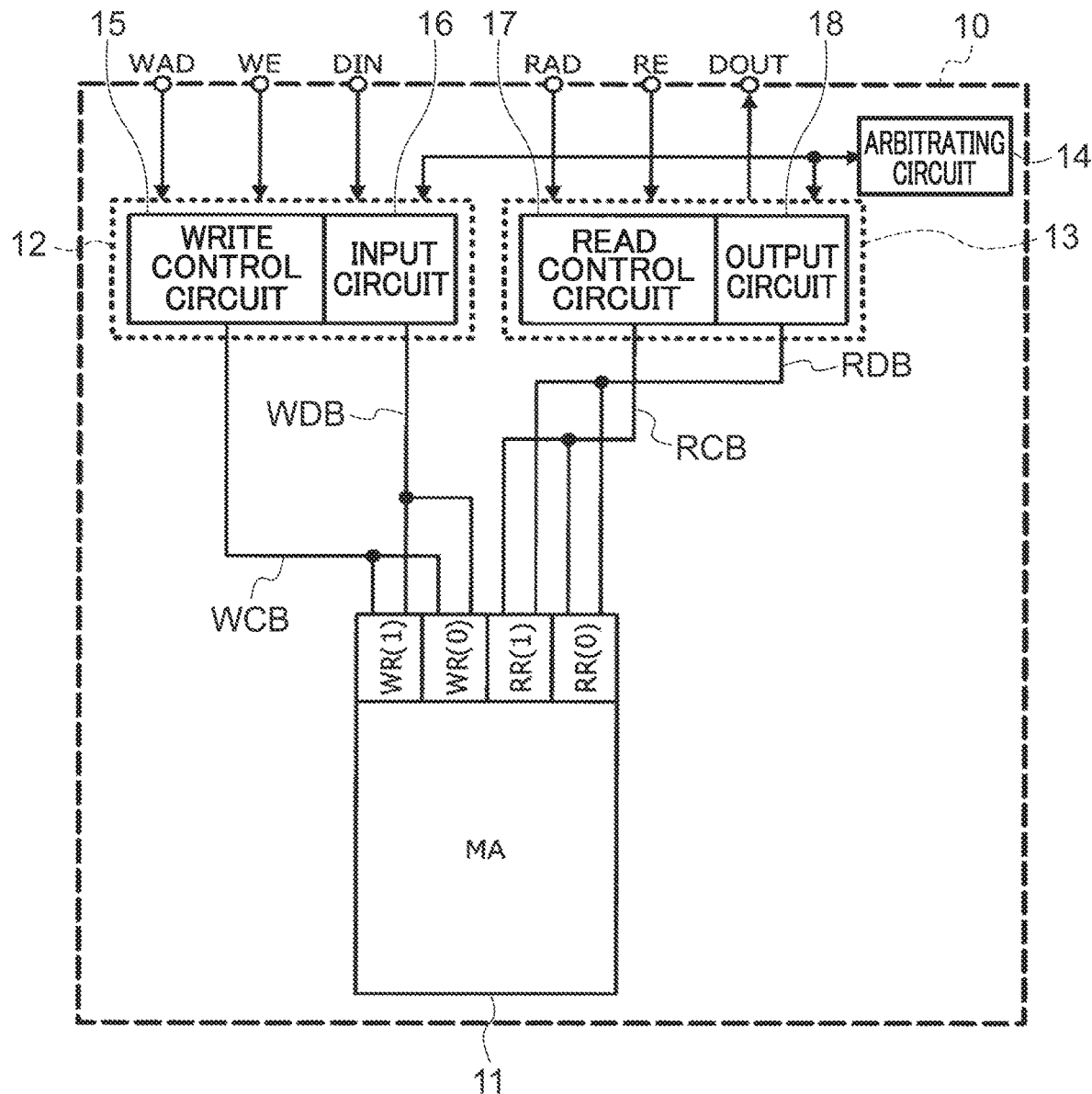
FIG. 1 is a block drawing showing an example of the structure of a semiconductor storage device relating to a first embodiment.

As shown in FIG. 1, a semiconductor storage device 10 relating to the present embodiment is structured to include a memory array (indicated by "MA" in FIG. 1) 11, a write circuit 12, a read circuit 13, and an arbitrating circuit 14. Further, the write circuit 12 has a write control circuit 15 and an input circuit 16. The read circuit 13 has a read control circuit 17 and an output circuit 18. Note that the arbitrating circuit 14 is an example of the "timing control circuit" relating to the present disclosure.

A write data bus WDB and a write control bus WCB are disposed between the write circuit 12 and the memory array 11. The write data bus WDB and the write control bus WCB are each branched in two, and are inputted to a write register WR(0) and a write register WR(1) (called "write registers WR" when referred to collectively hereinafter) that are provided at the memory array 11. On the other hand, a read data bus RDB and a read control bus RCB are disposed between the read circuit 13 and the memory array 11. The read data bus RDB and the read control bus RCB are each branched in two, and are inputted to a read register RR(0) and a read register RR(1) (called "read registers RR" when referred to collectively hereinafter) that are provided at the memory array 11.

In FIG. 1, write data that is to be written to the memory array 11 is inputted to a DIN terminal of the semiconductor storage device 10. A write clock is inputted to a WE terminal, and the write address to the memory array 11 is inputted to a WAD terminal. On the other hand, a read clock is inputted to an RE terminal, the read address to the memory array 11 is inputted to an RAD terminal, and read data that is read-out from the memory array 11 is outputted from DOUT terminal.

The write data is, via the input circuit 16, stored in the write register WR(0) or the write register WR(1). The write register WR(0) or the write register WR(1) is selected via the write control bus WCB by a signal generated by the write control circuit 15. The write data that is stored in the selected write register WR(0) or write register WR(1) is written to the memory array 11. The write address into the memory array 11 is selected by the write control bus WCB via the terminal WAD.

On the other hand, read data, which is read-out from the memory array 11 on the basis of a read address selected via the read control bus RCB, is stored in the read register RR(0) or the read register RR(1). The read register RR(0) or the read register RR(1) is selected by the read control bus RCB. The read data that is stored in the selected read register RR(0) or read register RR(1) is outputted to the read data bus RDB, and is outputted from the DOUT terminal via the output circuit 18.

The write registers WR(0) and WR(1) and the read registers RR(0) and RR(1) have capacities such that they can store data of the number of bits per low address of the memory array 11. The writing timing and the reading timing to and from the memory array 11 are adjusted by the arbitrating circuit 14 such that there is no conflict in accessing the memory array 11. The arbitrating circuit 14 also carries out refreshing of the DRAM and adjusting of the writing timing and the reading timing. Namely, adjustment is carried out by the arbitrating circuit 14 such that the respective accesses of the writing processing, the reading processing and the refreshing processing at the memory array 11 do not conflict with one another. As an example, the adjustment at the arbitrating circuit 14 is carried out by, after a given processing is executed, prohibiting access of another processing for a given time period.

Operation of the semiconductor storage device 10 relating to the present embodiment is described with reference to FIG. 2.

Figure 2:
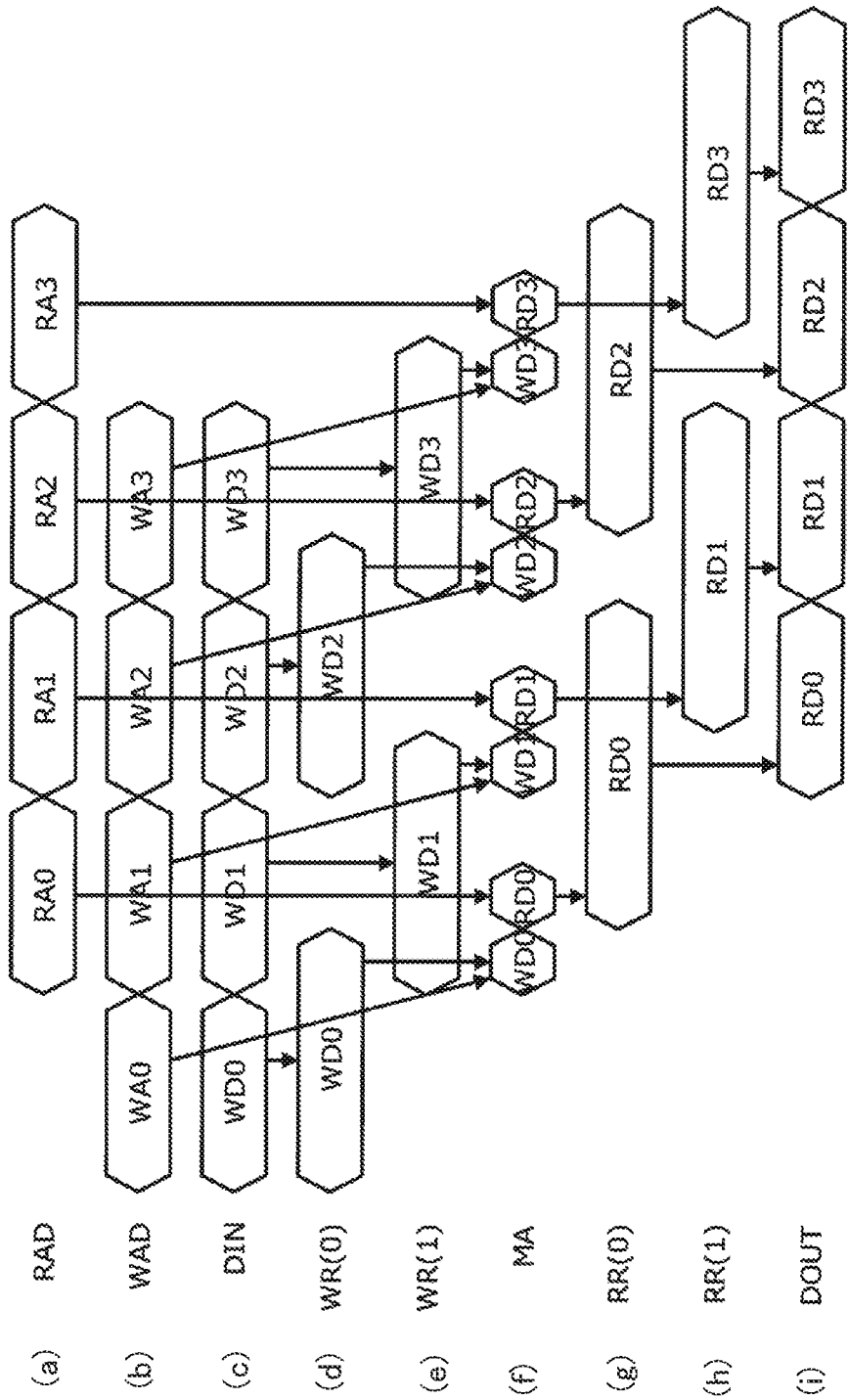
FIG. 2 is a timing chart showing operations of respective sections of the semiconductor storage device relating to the first embodiment.

FIG. 2 is a timing chart showing the waveforms of the respective sections of the semiconductor storage device 10. In FIG. 2, (a) shows the waveform of the read addresses at the RAD terminal, (b) shows the waveform of the write addresses at the WAD terminal, (c) shows the waveform of the write data at the DIN terminal, (d) shows the waveform of the write data at the write register WR(0), (e) shows the waveform of the write data at the write register WR(1), (0 shows the waveform of the write data or the read data at the memory array 11, (g) shows the waveform of the read data at the read register RR(0), (h) shows the waveform of the read data at the read register RR(1), and (i) shows the waveform of the read data at the DOUT terminal.

The first writing is with respect to write address group WA0 and write data group WD0. If the write address group WA0 is addresses for the same low address of the memory array 11, and there are continuous cycles, input to plural addresses is possible. In this case, for the write data group WD0 as well, plural write data are inputted in correspondence with the plural write address groups WA0. The write data group WD0 is stored in the write register WR(0). After storage of all of the write data group WD0 is completed, the stored write data group WD0 is written to the low addresses that correspond to the address groups WA0 of the memory array 11.

The first reading is with respect to read address group RA0. The read address group RA0 is addresses for the same low address of the memory array 11. Read data group RD0 that is read-out from the low address corresponding to the read address group RA0 is stored in the read register RR(0), and thereafter, the read data are selected from the read register RR(0) in the order of the addresses of the inputted read address group RA0, and are outputted in order to the DOUT terminal.

The second writing is with respect to write address group WA1 and write data group WD1. If the write address group WA1 is addresses for the same low address of the memory array 11, and there are continuous cycles, input to plural addresses is possible. In this case, for the write data group WD1 as well, plural write data are inputted in correspondence with the plural write address groups WA1. The write data group WD1 is stored in the write register WR(1). After storage of all of the write data group WD1 is completed, the stored write data group WD1 is written to the low addresses that correspond to the address groups WA1 of the memory array 11.

The second reading is with respect to read address group RA1. The read address group RA1 is addresses for the same low address of the memory array 11. Read data group RD1 that is read-out from the low address corresponding to the read address group RA1 is stored in the read register RR(1), and thereafter, the read data are selected from the read register RR(1) in the order of the addresses of the inputted read address group RA1, and are outputted in order to the DOUT terminal.

The third writing is with respect to write address group WA2 and write data group WD2. If the write address group WA2 is addresses for the same low address of the memory array 11, and there are continuous cycles, input to plural addresses is possible. In this case, for the write data group WD2 as well, plural write data are inputted in correspondence with the plural write address groups WA2. The write data group WD2 is stored in the write register WR(0). After storage of all of the write data group WD2 is completed, the stored write data group WD2 is written to the low addresses that correspond to the address groups WA2 of the memory array 11.

The third reading is with respect to read address group RA2. The read address group RA2 is addresses for the same low address of the memory array 11. Read data group RD2 that is read-out from the low address corresponding to the read address group RA2 is stored in the read register RR(0), and thereafter, the read data are selected from the read register RR(0) in the order of the addresses of the inputted read address group RA2, and are outputted in order to the DOUT terminal.

The fourth writing is with respect to write address group WA3 and write data group WD3. If write address group WA3 is addresses for the same low address of the memory array 11, and there are continuous cycles, input to plural addresses is possible. In this case, for the write data group WD3 as well, plural write data are inputted in correspondence with the plural write address groups WA3. The write data group WD3 is stored in the write register WR(1). After storage of all of the write data group WD3 is completed, the stored write data group WD3 is written to the low addresses that correspond to the address groups WA3 of the memory array 11.

The fourth reading is with respect to read address group RA3. The read address group RA3 is addresses for the same low address of the memory array 11. Read data group RD3 that is read-out from the low address corresponding to the read address group RA3 is stored in the read register RR(1), and thereafter, the read data are selected from the read register RR(1) in the order of the addresses of the inputted read address group RA3, and are outputted in order to the DOUT terminal.

The writing processing and reading processing of one cycle at the semiconductor storage device 10 are executed by the above-described operations. At the semiconductor storage device 10, processing is executed even if the writing processing and the reading processing overlap, as with the write address group WA1 and the read address group RA0 shown in FIGS. 2(a) and (b) for example. Further, processing is carried out even if, for example, the write data or the read data are lengths that overlap one another, as with the write data groups WD0 and WD1 shown in FIGS. 2(d) and (e) or the read data groups RD0 and RD1 shown in FIGS. 2(g) and (h). Note that, although not illustrated in FIG. 2, the refreshing processing at the semiconductor storage device 10 is executed, for example, at a timing that is after the read data RD and before the next write data WD shown in FIG. 2(f).

As described in detail above, in the semiconductor storage device 10 relating to the present embodiment, by providing two of each of the write registers and read registers for the memory array 11, simultaneous access for the reading processing and the writing processing is possible without dividing the memory array 11.

Figure 4:
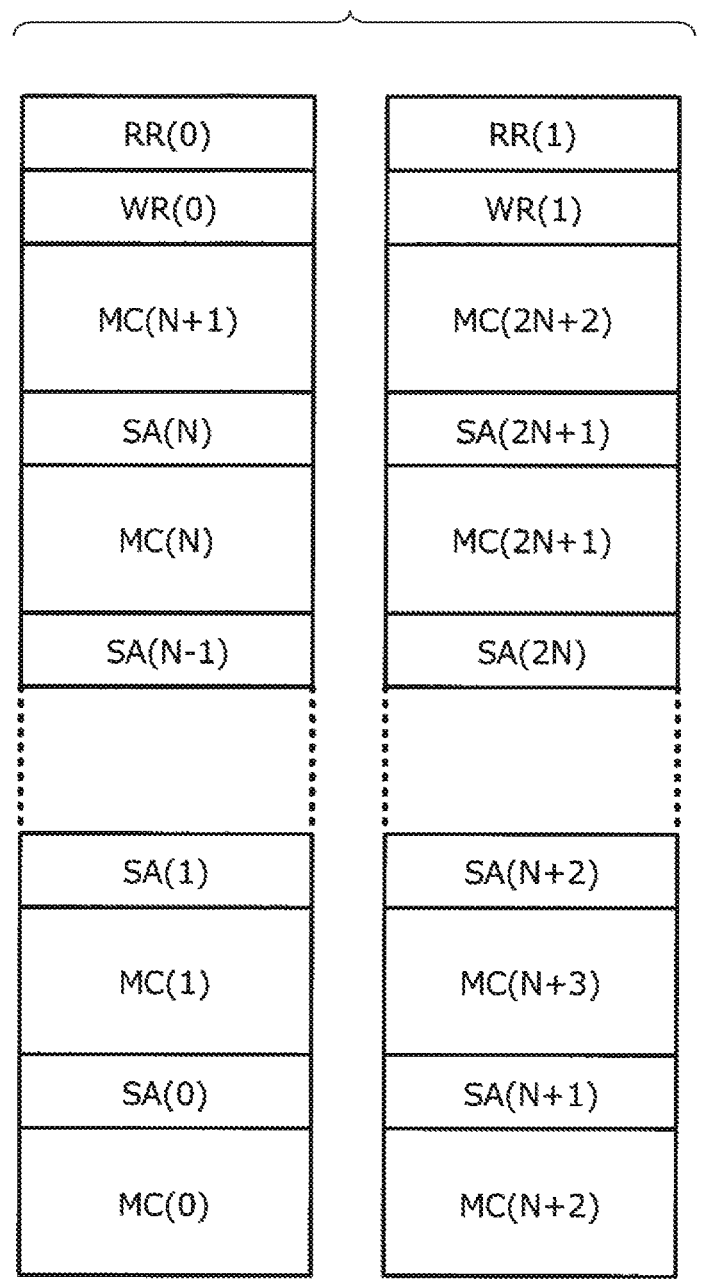
FIG. 4 is a schematic drawing of the circuit area of a semiconductor storage device relating to a comparative example.

The circuit area (the layout area) of the semiconductor storage device 10 is described next. FIG. 4 is schematic drawing of the circuit area of a semiconductor storage device relating to a comparative example in a case in which the memory array is divided in two. In FIG. 4, MC(0) through MC(2N+2) indicate memory cell blocks, SA(0) through SA(2N+2) indicate sense amplifier blocks, RR(0) and RR(1) indicate read registers, and WR(0) and WR(1) indicate write registers. The memory cell blocks MC are aggregates of plural memory cells, and the sense amplifier blocks SA amplify the signals (e.g., voltage signals) from the memory cell blocks MC.

Here, generally, one sense amplifier block SA is provided in common for two memory cell blocks MC, and, as shown in FIG. 4, a sense amplifier block SA contacts only one side of the memory cell blocks MC(0), MC(N+1), MC(N+2) and MC(2N+2). Therefore, for these memory cell blocks MC, the effective memory cell blocks MC are respectively half of the other memory cell blocks MC. As a result, in order to obtain a capacity of 2N memory cell blocks MC at the semiconductor storage device relating to the present comparative example, there is the need for 2N+2 of the memory cell blocks MC, 2N+2 of the sense amplifier blocks SA, two of the read registers RR, and two of the write registers WR.

Figure 3:
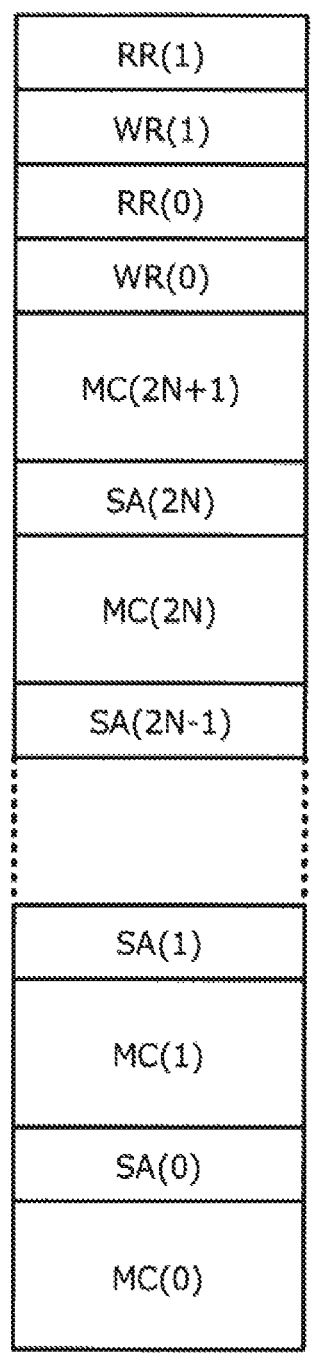
FIG. 3 is a schematic drawing of the circuit area of the semiconductor storage device relating to the first embodiment.

In contrast with the semiconductor storage device relating to the above-described comparative example, FIG. 3 is a schematic drawing of the circuit area in the case of the semiconductor storage device 10 relating to the present embodiment, i.e., a case in which the memory array 11 is not divided. In FIG. 3, MC(0) through MC(2N+1) indicate memory cell blocks, SA(0) through SA(2N+1) indicate sense amplifier blocks, RR(0) and RR(1) indicate read registers, and WR(0) and WR(1) indicate write registers.

As shown in FIG. 3, in order to obtain the capacity of 2N memory cell blocks MC at the semiconductor storage device 10, with respect to the memory cell blocks MC(0) and MC(2N+1) at which only one side is contacted by a sense amplifier block SA, the effective memory cell blocks MC are respectively half of the other memory cell blocks MC. Therefore, in the semiconductor storage device 10 relating to the present embodiment, there is the need for 2N+1 of the memory cell blocks MC, 2N+1 of the sense amplifier blocks SA, two of the read registers RR, and two of the write registers WR.

Namely, as compared with the semiconductor storage device relating to the above-described comparative example in which the memory array is divided, in the semiconductor storage device 10 relating to the present embodiment, the circuit area can be reduced by one memory cell block MC and one sense amplifier block SA. The present example describes, as an example of the semiconductor storage device relating to the comparative example, a case in which the memory array is divided in two. However, the greater the number of times that the memory array is divided, the more superior the semiconductor storage device 10 becomes in terms of the layout area. Moreover, in the semiconductor storage device 10, because division of the memory array 11 by address is not carried out, in a case in which simultaneous access of a reading processing and a writing processing arises, there is no need to carry out conflict judgement in accordance with the address. As a result, the arbitrating circuit can be made to be small as compared with in the semiconductor storage device relating to the comparative example in which the memory array is divided.

Second Embodiment

Figure 5:
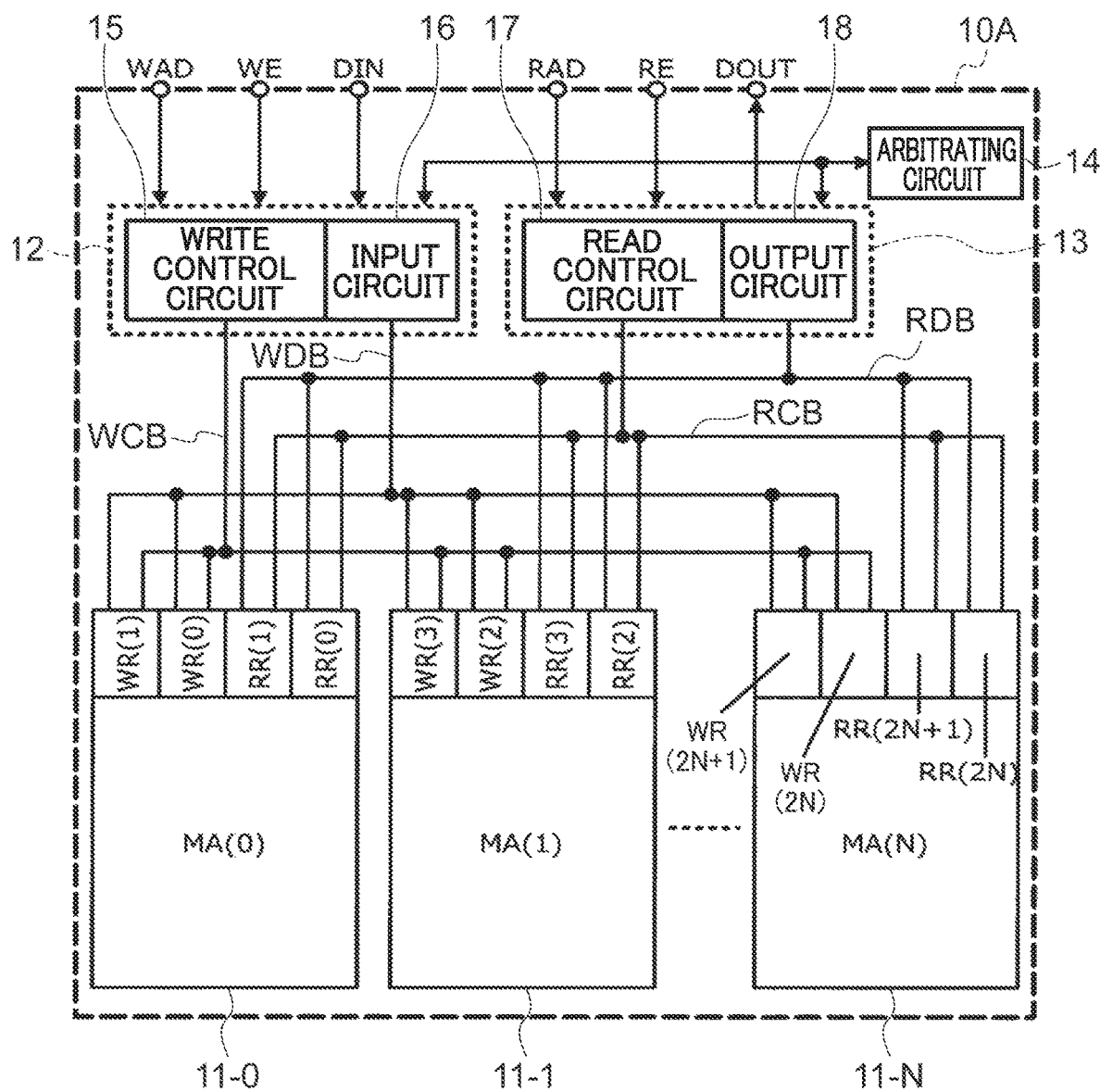
FIG. 5 is a block drawing showing an example of the structure of a semiconductor storage device relating to a second embodiment.

A semiconductor storage device 10A relating to a second embodiment is described with reference to FIG. 5. As compared with the semiconductor storage device 10 relating to the above-described embodiment, the semiconductor storage device 10A is a form in which (N+1) memory arrays 11-0 (indicated by "MA(0)" in FIG. 5) through memory array 11-N (indicated by "MA(N)" in FIG. 5) are connected in parallel. Accordingly, structures that are similar to those of the semiconductor storage device 10 are denoted by the same reference numerals, and detailed description thereof is omitted. In the structure of the semiconductor storage device 10A shown in FIG. 5, the bus widths of the read data base RDB and the write data bus WDB are respectively N times those of the semiconductor storage device 10. Note that the bus widths of the read control bus RCB and the write control bus WCB are unchanged.

Figure 6:
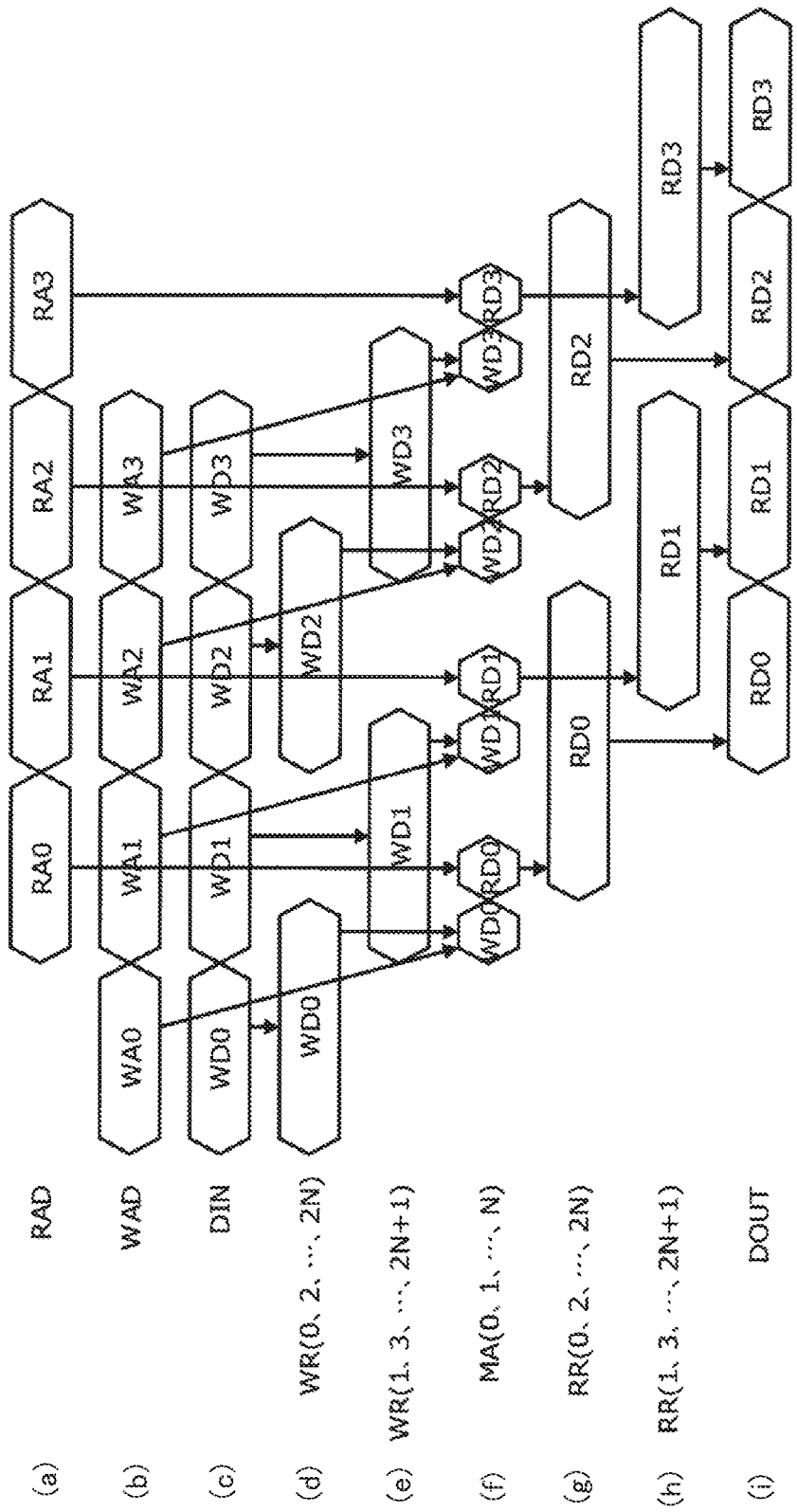
FIG. 6 is a timing chart showing operations of respective sections of the semiconductor storage device relating to the second embodiment.

Operation of the semiconductor storage device 10A relating to the second embodiment is described with reference to FIG. 6. FIG. 6 is a timing chart showing the waveforms of the respective sections of the semiconductor storage device 10A. In FIG. 2, (a) shows the waveform of the read addresses at the RAD terminal, (b) shows the waveform of the write addresses at the WAD terminal, (c) shows the waveform of the write data at the DIN terminal, (d) shows the waveform of the write data at write registers WR(0), WR(2), ..., WR(2N), (e) shows the waveform of the write data at write registers WR(1), WR(3), ..., WR(2N+1), (f) shows the waveform of the write data or the read data at memory arrays 11-0 through 11-N (called "memory arrays 11" when referred to collectively hereinafter), (g) shows the waveform of the read data at read registers RR(0), RR(2), ..., RR(2N), (h) shows the waveform of the read data at read registers RR(1), RR(3), ..., RR(2N+1), and (i) shows the waveform of the read data at the DOUT terminal.

The first writing is with respect to write address group WA0 and write data group WD0. If the write address group WA0 is addresses for the same low address of the respective memory arrays of memory array 11-0 through memory array 11-N, and there are continuous cycles, input to plural addresses is possible. In this case, for the write data group WD0 as well, plural write data are inputted in correspondence with the write address group WA0. The write data group WD0 is stored in the write registers WR(0), WR(2), . . . , WR(2N). After storage of all of the write data group WD0 is completed, the stored write data group WD0 is written to the low addresses of the respective memory arrays 11 for the address group WA0 of the memory array 11-0 through memory array 11-N.

The first reading is with respect to read address group RA0. The read address group RA0 is addresses for the same low address of the respective memory arrays of the memory array 11-0 through memory array 11-N. Read data group RD0, which is read-out from the low addresses of the respective memory arrays corresponding to the read address group RA0, is stored in the read registers RR(0), RR(2), . . . , RR(2N), and thereafter, the read data are selected from the respective read registers RR(0), RR(2), . . . , RR(2N) in the order of the addresses of the inputted read address group RA0, and are outputted in order to the DOUT terminal.

The second writing is with respect to write address group WA1 and write data group WD1. If the write address group WA1 is addresses for the same low address of the respective memory arrays of memory array 11-0 through memory array 11-N, and there are continuous cycles, input to plural addresses is possible. In this case, for the write data group WD1 as well, plural write data are inputted in correspondence with the write address group WA1. The write data group WD1 is stored in write registers WR(1), WR(3), . . . , WR(2N+1). After storage of all of the write data group WD1 is completed, the stored write data group WD1 is written to the low addresses of the respective memory arrays for the address group WA1 of the memory array 11-0 through memory array 11-N.

The second reading is with respect to read address group RA1. The read address group RA1 is addresses for the same low address of the respective memory arrays of the memory array 11-0 through memory array 11-N. Read data group RD1, which is read-out from the low addresses of the respective memory arrays corresponding to the read address group RA1, is stored in read registers RR(1), RR(3), . . . , RR(2N+1), and thereafter, the read data are selected from the respective read registers RR(1), RR(3), . . . , RR(2N+1) in the order of the addresses of the inputted read address group RA1, and are outputted in order to the DOUT terminal.

The third writing is with respect to write address group WA2 and write data group WD2. If the write address group WA2 is addresses for the same low address of the respective memory arrays of memory array 11-0 through memory array 11-N, and there are continuous cycles, input to plural addresses is possible. In this case, for the write data group WD2 as well, plural write data are inputted in correspondence with the write address group WA2. The write data group WD2 is stored in the write registers WR(0), WR(2), . . . , WR(2N). After storage of all of the write data group WD2 is completed, the stored write data group WD2 is written to the low addresses of the respective memory arrays for the address group WA2 of the memory array 11-0 through memory array 11-N.

The third reading is with respect to read address group RA2. The read address group RA2 is addresses for the same low address of the respective memory arrays of the memory array 11-0 through memory array 11-N. Read data group RD2, which is read-out from the low addresses of the respective memory arrays corresponding to the read address group RA2, is stored in the read registers RR(0), RR(2), . . . , RR(2N), and thereafter, the read data are selected from the respective read registers RR(0), RR(2), . . . , RR(2N) in the order of the addresses of the inputted read address group RA2, and are outputted in order to the DOUT terminal.

The fourth writing is with respect to write address group WA3 and write data group WD3. If the write address group WA3 is addresses for the same low address of the respective memory arrays of memory array 11-0 through memory array 11-N, and there are continuous cycles, input to plural addresses is possible. In this case, for the write data group WD3 as well, plural write data are inputted in correspondence with the write address group WA3. The write data group WD3 is stored in the write registers WR(1), WR(3), . . . , WR(2N+1). After storage of all of the write data group WD3 is completed, the stored write data group WD3 is written to the low addresses of the respective memory arrays for the address group WA3 of the memory array 11-0 through memory array 11-N.

The fourth reading is with respect to read address group RA3. The read address group RA3 is addresses for the same low address of the respective memory arrays of the memory array 11-0 through memory array 11-N. Read data group RD3, which is read-out from the low addresses of the respective memory arrays corresponding to the read address group RA3, is stored in the read registers RR(1), RR(3), . . . , RR(2N+1), and thereafter, the read data are selected from the respective read registers RR(1), RR(3), . . . , RR(2N+1) in the order of the addresses of the inputted read address group RA3, and are outputted in order to the DOUT terminal.

The writing processing and reading processing of one cycle at the semiconductor storage device 10A are executed by the above-described operations. As described in detail above, in accordance with the second embodiment, by connecting plural memory arrays in parallel, the data transfer rate can be easily improved without changing the circuit structure.

Note that the above-described second embodiment describes improving the transfer rate by enlarging the bus widths of the read data bus RDB and the write data bus WDB. However, the number of addresses can also be increased by providing a circuit, which parallel-serial converts the read data and outputs the converted data to the read data bus RDB, at the output circuit, and providing a circuit, which serial-parallel converts the write data and outputs the converted data to the write data bus WDB, at the input circuit.

Further, the above-described respective embodiments describe examples of forms in which one pair of each of the write registers WR and read registers RR are provided. However, the present disclosure is not limited to this, and may be of a form in which three or more pairs of the write registers WR and the read registers RR are provided.

What is claimed is:

1. A semiconductor storage device comprising:
 a memory array at which writing and reading of a plurality of data are carried out;
 one pair of write registers that temporarily store write data that is to be written into the memory array; and
 one pair of read registers that temporarily store read data that is read-out from the memory array,
 wherein the memory array is a single undivided array comprising blocks that are accessible by the one pair of write registers and the one pair of read registers.

2. The semiconductor storage device of claim 1, further comprising:
   a write control circuit that causes received write data to be alternately stored in the one pair of write registers per low address of the memory array; and
   a read control circuit that causes read data, which are read-out from the memory array with respect to input read addresses, to be alternately stored in the one pair of read registers per low address of the memory array.

3. The semiconductor storage device of claim 2, wherein the read control circuit selects and outputs read data corresponding to a read address, from a read register from among the one pair of read registers that stores read data that has been read-out from the memory array.

4. The semiconductor storage device of claim 1, further comprising:
   a timing control circuit that controls such that timing of writing processing and timing of reading processing with respect to the memory array do not overlap.

5. The semiconductor storage device of claim 1, comprising:
   a plurality of memory arrays including the memory array;
   a plurality of additional pairs of write registers; and
   a plurality of additional pairs of read registers.

* * * * *